United States Patent
Hekmat et al.

(10) Patent No.: US 10,541,649 B2
(45) Date of Patent: *Jan. 21, 2020

(54) DIGITAL CALIBRATION FOR MULTIPHASE OSCILLATORS

(71) Applicant: Rambus Inc., Sunnyvale, CA (US)

(72) Inventors: Mohammad Hekmat, Mountain View, CA (US); Reza Navid, San Jose, CA (US)

(73) Assignee: Rambus Inc., Sunnyvale, CA (US)

(*) Notice: Subject to any disclaimer, the term of this patent is extended or adjusted under 35 U.S.C. 154(b) by 275 days.

This patent is subject to a terminal disclaimer.

(21) Appl. No.: 15/638,329

(22) Filed: Jun. 29, 2017

(65) Prior Publication Data

US 2017/0359027 A1    Dec. 14, 2017

Related U.S. Application Data

(63) Continuation of application No. 14/858,965, filed on Sep. 18, 2015, now Pat. No. 9,722,539, which is a continuation of application No. 13/925,330, filed on Jun. 24, 2013, now Pat. No. 9,166,603.

(60) Provisional application No. 61/669,855, filed on Jul. 10, 2012.

(51) Int. Cl.
*H03B 27/00* (2006.01)
*H03L 7/06* (2006.01)
*H03L 7/23* (2006.01)
*H03L 7/099* (2006.01)
*H03L 7/089* (2006.01)

(52) U.S. Cl.
CPC ............... *H03B 27/00* (2013.01); *H03L 7/06* (2013.01); *H03L 7/089* (2013.01); *H03L 7/099* (2013.01); *H03L 7/23* (2013.01)

(58) Field of Classification Search
CPC ... H03L 7/093; H03L 7/18; H03L 7/06; H03L 7/099; H03L 7/23; H03L 7/089; H03B 27/00
USPC ............... 331/57, 167, 117 FE, 46, 2, 74, 45
See application file for complete search history.

(56) References Cited

U.S. PATENT DOCUMENTS

| | | | |
|---|---|---|---|
| 6,194,971 B1 * | 2/2001 | Glen | H03L 7/081 327/156 |
| 6,441,667 B1 | 8/2002 | Boerstler et al. | |
| 7,656,239 B2 | 2/2010 | Bietti et al. | |
| 7,746,182 B2 | 6/2010 | Ramaswamy et al. | |
| 7,940,830 B2 | 5/2011 | Marsill et al. | |
| 8,362,809 B2 | 1/2013 | Li et al. | |
| 8,432,229 B2 | 4/2013 | Dong et al. | |
| 9,166,603 B2 * | 10/2015 | Hekmat | H03L 7/06 |
| 2011/0215872 A1 | 9/2011 | Kobayashi | |
| 2011/0298503 A1 | 12/2011 | Obkircher et al. | |
| 2012/0013407 A1 | 1/2012 | Takinami et al. | |

* cited by examiner

*Primary Examiner* — Arnold M Kinkead
(74) *Attorney, Agent, or Firm* — Fenwick & West LLP

(57) ABSTRACT

A phase-locked loop circuit comprises a multi-phase oscillator having a plurality of coupled oscillators. A calibration module detects mismatches between frequency characteristics of the different oscillators in the phase-locked loop circuit during a calibration process. The calibration module then calibrates the various oscillators to compensate for the detected mismatch. Once calibrated, the phase-locked loop circuit can operate with little or no performance degradation despite the mismatch in frequency characteristics between the different oscillators.

20 Claims, 6 Drawing Sheets

DIGITAL CALIBRATION FOR MULTIPHASE OSCILLATORS

CROSS REFERENCE TO RELATED APPLICATIONS

This application is a continuation of U.S. patent application Ser. No. 14/858,965 entitled "Digital Calibration for Multiphase Oscillators," to Mohammad Hekmat and Reza Navid filed on Sep. 18, 2015, now U.S. Pat. No. 9,722,539, which is a continuation of U.S. patent application Ser. No. 13/925,330, now U.S. Pat. No. 9,166,603, entitled "Digital Calibration for Multiphase Oscillators," to Mohammad Hekmat and Reza Navid filed on Jun. 24, 2013, which claims the benefit of U.S. Provisional Application No. 61/669,855 entitled "Digital Calibration for Multiphase Oscillators" to Mohammad Hekmat and Reza Navid, filed on Jul. 10, 2012. The contents of each of the above-mentioned applications are incorporated by reference herein.

BACKGROUND

Frequency synthesizers are commonly used in wireless communication systems for generating a range of frequencies from one or more oscillators. A phase-locked loop circuit having two or more coupled oscillators is one possible choice for generating multi-phase high-frequency signals with low jitter. However, traditional phase-locked loop circuits in this configuration are sensitive to component mismatch between the coupled oscillators. Such mismatch can lead to severe phase errors and phase noise degradation. Furthermore, in some cases, this mismatch can inhibit locking of the oscillators in the loop which can cause a complete malfunction of the phase-locked loop circuit.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

A phase-locked loop circuit comprises a multi-phase oscillator having a plurality of coupled oscillators. A calibration module detects mismatches between frequency characteristics of the different oscillators in the phase-locked loop circuit during a calibration process. The calibration module then calibrates the various oscillators to compensate for the detected mismatch. Once calibrated, the phase-locked loop circuit can operate with little or no performance degradation despite the mismatch in frequency characteristics between the different oscillators.

Multi-Phase Phase-Locked Loop Circuit

Figure 1:
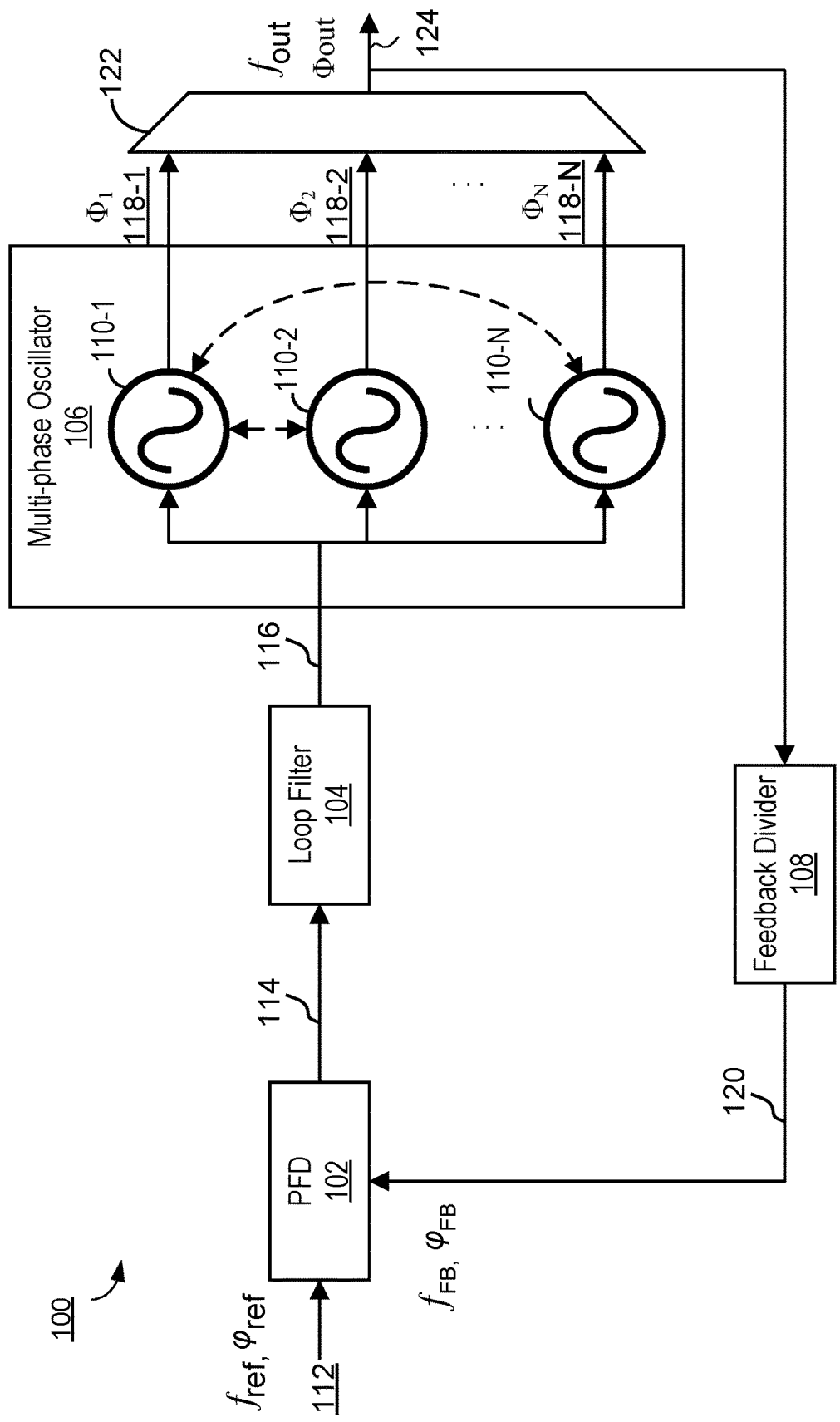
FIG. 1 illustrates a phase-locked loop circuit having a multi-phase oscillator with a plurality of coupled oscillators according to one embodiment.

FIG. 1 illustrates a high level block diagram of a phase-locked loop (PLL) circuit 100 according to one embodiment. PLL circuit 100 receives a reference signal 112 having a reference frequency $f_{REF}$ and generates an output signal 124 having an output frequency $f_{OUT}$ and an output phase $\Phi_{OUT}$. In one embodiment, the PLL circuit 100 comprises a phase frequency detector (PFD) 102, a loop filter 104, a multi-phase oscillator 106, a multiplexer 122, and a feedback divider 108. Alternative embodiments may include different or additional components configured to achieve the functionality of the PLL circuit 100 described herein.

Phase frequency detector 102 receives reference signal 112 having the reference frequency $f_{REF}$ and reference phase $\varphi_{ref}$ and a PLL feedback signal 120 having a feedback frequency $f_{FB}$ and a phase $\varphi_{FB}$. Phase frequency detector 102 detects the difference in phase and frequency between reference signal 112 and feedback signal 120 and generates phase difference signal 114 indicating whether feedback signal 120 lags or leads reference signal 112. For example, in one embodiment, phase difference signal 114 comprises an "up signal" (e.g., a logic high signal) if feedback signal 120 leads reference signal 112 (indicating that the PLL frequency should be increased) and phase difference signal 114 comprises a "down signal" (e.g., a logic low signal) if feedback signal 120 lags reference signal 112 (indicating that the PLL frequency should be decreased). Loop filter 104 filters out the high-frequency components of the up/down signal when switching between the up configuration and the down configuration. Loop filter 104 outputs a frequency control signal 116 for controlling the oscillating frequency of multi-phase oscillator 106. In one embodiment, loop filter 104 comprises a digital filter that generates a digital frequency selection code as frequency control signal 116. For example, the frequency control signal may represent a digital code from a predetermined set of possible frequency codes. An example of such a digital filter is described in further detail below with respect to FIG. 2. Alternatively, loop filter 104 may comprise an analog filter (e.g., an RC filter).

Multi-phase oscillator 106 receives frequency control signal 116 and generates a plurality of output signals 118-1, 118-2, ..., 118-N at frequency $f_{OUT}$ having phases $\Phi_1$, $\Phi_2$, ..., $\Phi_N$ respectively. In one embodiment, multi-phase oscillator 106 comprises a plurality of oscillators 110-1, 110-2, ..., 110-N coupled in a loop, with each oscillator 110 providing a respective output signal 118-1, 118-2, ..., 118-N having different phases but having a common output frequency $f_{OUT}$. For example, the various oscillators 110-1, 110-2, ..., 110-N may each comprise an LC-based oscillator that is electrically and/or magnetically coupled to two or more other oscillators in a ring configuration. Examples of multi-phase oscillator 106 will be described in further detail below.

In one embodiment, the multi-phase oscillator 106 operates to produce outputs having equally spaced phases between 0° and 180°. For example, if four oscillators are used, the stages may have outputs of 0°, 45°, 90°, and 135°. If six oscillators are used, the stages may have outputs of 0°, 30°, 60°, 90°, 120°, and 150°. Thus, in general, a multi-phase oscillator 106 having N oscillators will produce outputs separated in phase by 180°/N.

Multiplexer 122 receives multi-phase outputs 118-1, 118-2, ..., 118-N from the multi-phase oscillator 106 and selects one of the outputs 118 as a PLL output 124 having an output frequency $f_{OUT}$ and an output phase $\Phi_{OUT}$. Multiplexer 122 beneficially enables a PLL circuit 100 having a plurality of different selectable output phases which is useful for a variety of multi-phase applications. Furthermore, multiplexer 122 can be used in the PLL calibration process described in further detail below. For example, as will be described, multiplexer 122 can select different phase outputs of multi-phase oscillator 106 to be active in the PLL circuit 100 during different calibration stages, thereby isolating different oscillators of the multi-phase oscillator 106 and enabling independent calibration of each oscillator.

Feedback divider 108 receives PLL output signal 124 and divides the frequency of PLL output signal 124 to generate feedback signal 120. Feedback divider 108 may be an integer-N divider to implement an integer-N phase-locked loop circuit or a fractional-N divider to implement a fractional-N phase-locked loop circuit. Optionally, the feedback divider 108 may be omitted and output 124 may be used directly as PLL feedback signal 120.

The feedback loop of PLL circuit 100 operates to configure the output frequency $f_{OUT}$ so that once divided/reduced in frequency, the feedback frequency $f_{FB}$ will match the reference frequency $f_{REF}$. By varying the parameters of feedback divider 108, different frequencies for $f_{OUT}$ can be achieved at the output signal 124 from a single reference frequency $f_{REF}$. Furthermore, different phases for the output phase $\Phi_{OUT}$ can be achieved at output signal 124 by selecting different phases from the multi-phase oscillator outputs 118-1, 118-2, . . . , 118-N via multiplexer 122.

Figure 2:
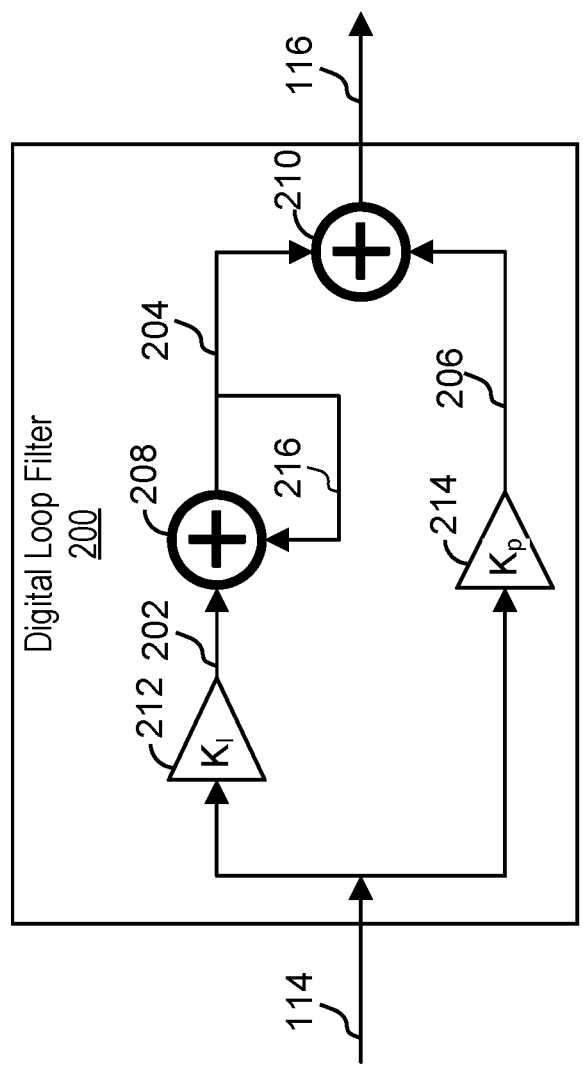
FIG. 2 illustrates a digital loop filter for a phase-locked loop circuit according to one embodiment.

FIG. 2 illustrates an example embodiment of a digital loop filter 200 that could be used as loop filter 104. The loop filter 200 comprises gain blocks $K_I$, $K_P$ and adders 208, 210. In the lower branch of loop filter 200, phase difference signal 114 is multiplied by proportional gain constant $K_P$ via gain block 214 to produce proportional gain signal 206. In the upper branch of loop filter 200, phase difference signal 114 is first multiplied by integral gain constant $K_I$ via gain black 212, and the result 202 of this multiplication is integrated via adder 208 and feedback path 216 to produce integrated signal 204. In various implementations, a delay block may be inserted in either the forward path or the feedback path 216 of the integrator to achieve the desired filtering effect. Adder 210 produces a sum of the integrated signal 204 from the upper branch and the proportional gain signal 206 from the lower branch of the loop filter 200 to provide frequency control signal 116. In alternative embodiments, different variations of loop filter 200 can be used including, for example, higher order filters or analog filters.

Figure 3:
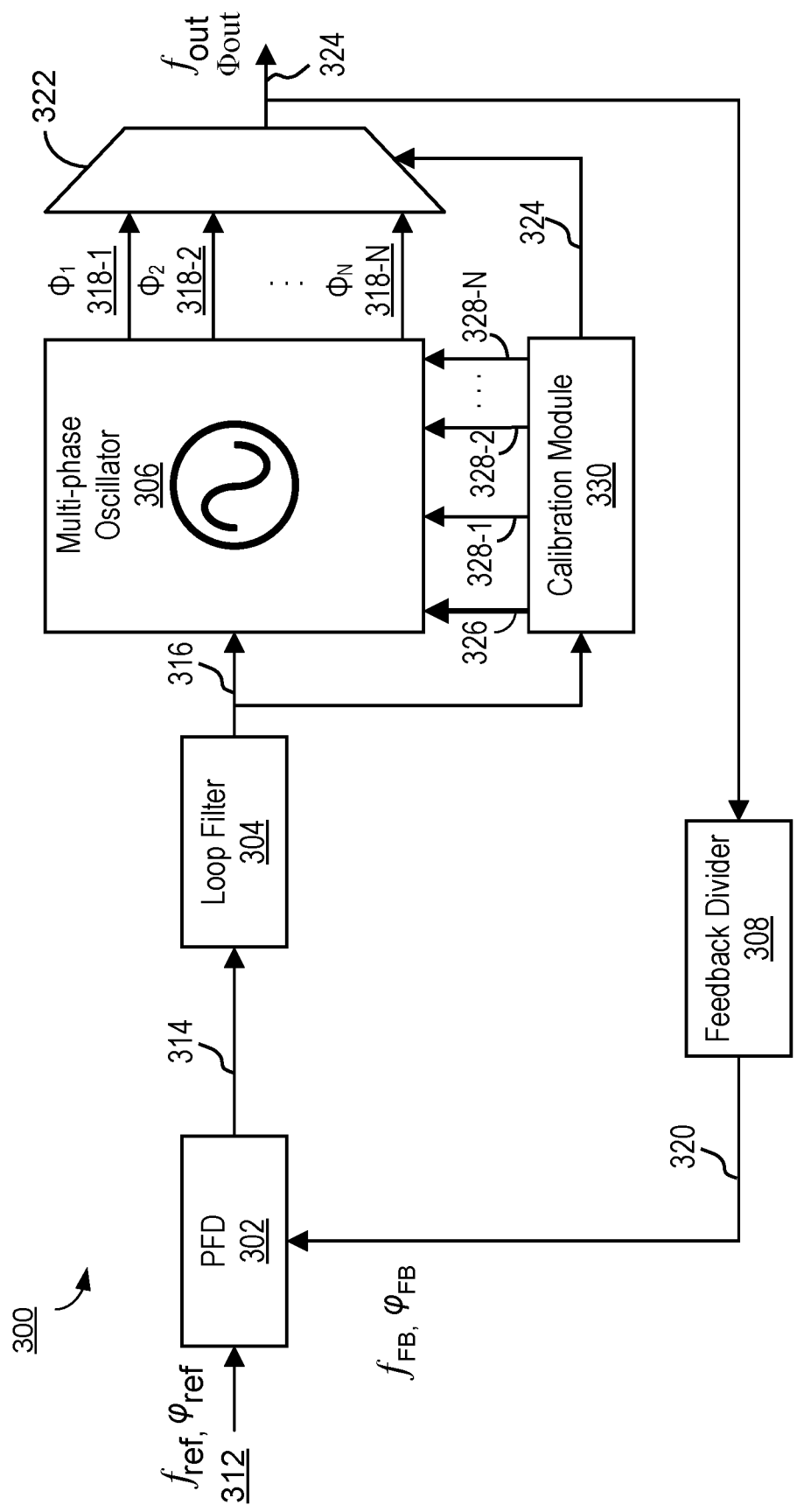
FIG. 3 illustrates a phase-locked loop circuit having a calibration module for calibrating a multi-phase oscillator according to one embodiment.

FIG. 3 illustrates an embodiment of a phase-locked loop circuit 300 that can be calibrated to compensate for frequency mismatch between the different oscillators of a multi-phase oscillator 306. Such frequency mismatch may occur due to manufacturing variations between the coupled oscillators and/or other imperfections that cause the oscillators to respond differently to a frequency control input. This mismatch, if left uncompensated, can result in phase mismatch between outputs 318 (e.g., the phases are not evenly spaced) or in the case of extreme mismatch, can result in failure of the phase-locked loop circuit 300 to lock frequency. The phase-locked loop circuit 300 of FIG. 3 therefore detects such mismatch between oscillators and compensates for the mismatch in order to avoid such errors and/or failures.

In one embodiment, the phase-locked loop circuit 300 comprises a phase-frequency detector 302, a loop filter 304, a multiplexer 322, a multi-phase oscillator 306, a calibration module 330, and a feedback divider 308. The PLL circuit 300 generally operates similarly to the PLL circuit 100 of FIG. 1. The loop filter 304 may be a digital loop filter such as the filter 200 described in FIG. 2 producing a digital frequency control signal 316, or may be an analog loop filter producing an analog frequency control signal 316. For example, frequency control signal 316 may be a voltage control signal for controlling voltage-controlled oscillators or a current control signal for controlling current-controlled oscillators. Multi-phase oscillator 306 comprises a plurality of coupled oscillators similar to oscillator 106 described above, but includes additional components to enable offset calibration to account for frequency mismatch between oscillators as will be described below. The oscillators may be digitally controlled via a digital frequency code, voltage-controlled via a voltage control signal, or current-controlled via a current control signal.

Calibration module 330 (e.g., a calibration circuit) calibrates multi-phase oscillator 306 according to a calibration process described in further detail below. In one embodiment, calibration module 330 generates offset calibration signals 328-1, 328-2, . . . , 328-N that control compensation of the oscillators of multi-phase oscillator 306 to correct for varying frequency characteristics of the oscillators. During the calibration process, calibration module 330 generates enable/disable signal 326 that isolates an individual oscillator within the multi-phase oscillator 306 for calibration so that only the selected oscillator for calibration is active in the PLL circuit 300. The calibration module 330 furthermore controls multiplexer 322 via select signal 324 to select the appropriate phase output signal 318 for the oscillator under calibration. The calibration module 316 then monitors the frequency control signal 316 to determine frequency characteristics of the oscillator under calibration and configures the offset calibration signal 328 to account for mismatches. An embodiment of the calibration process will be described in further detail below.

Figure 4:
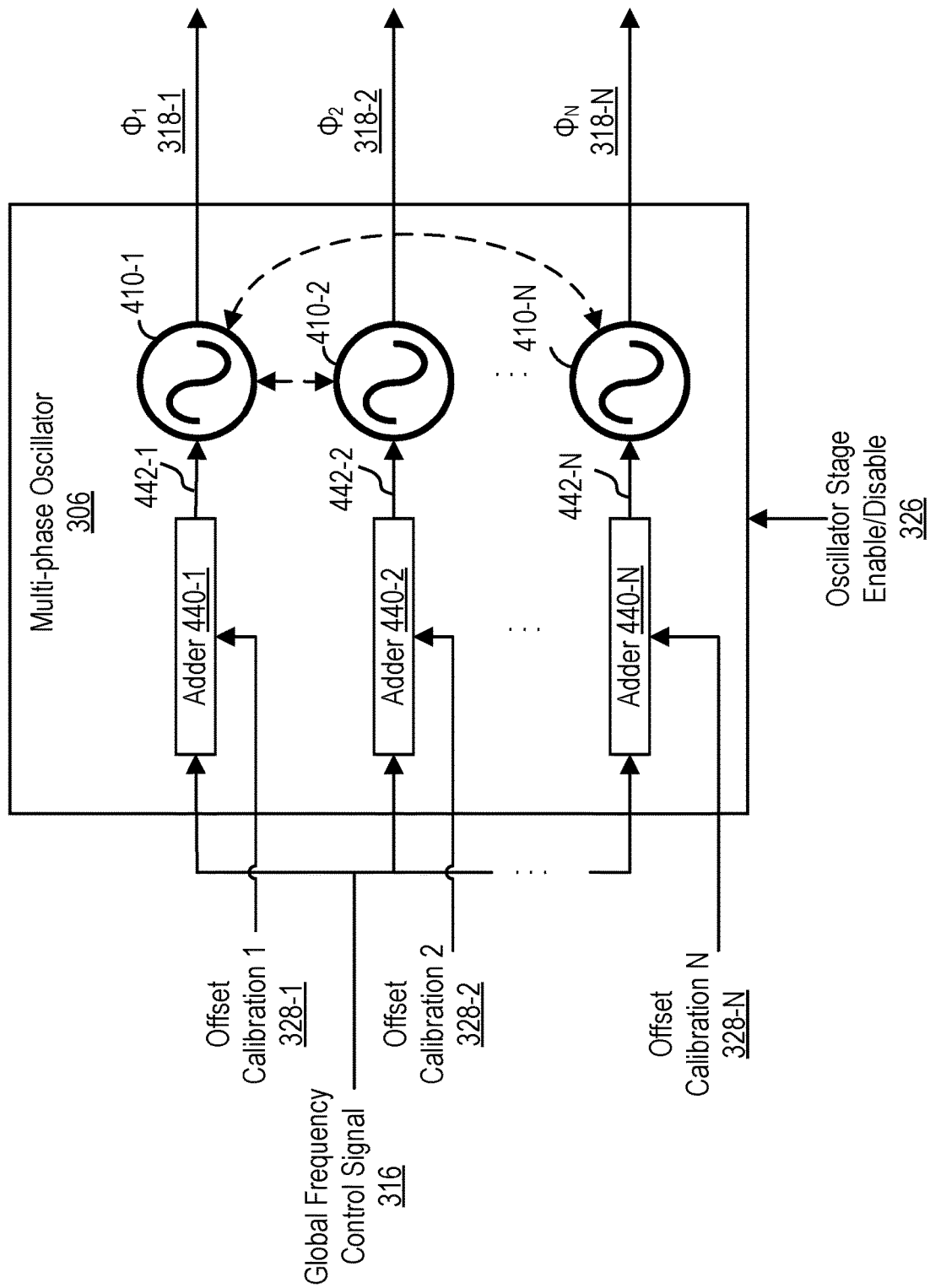
FIG. 4 illustrates a multi-phase oscillator having offset calibrations for a plurality of coupled oscillators according to one embodiment.

FIG. 4 illustrates a more detailed embodiment of multi-phase oscillator 306. Multi-phase oscillator 306 comprises a plurality of oscillators 410-1, 410-2, . . . , 410-N that are coupled to collectively control frequency of their respective outputs 318-1, 318-2, . . . , 318-N. These outputs have a common frequency $f_{OUT}$ but different phases $\Phi_1, \Phi_2, \ldots, \Phi_N$, as described above. Instead of being controlled directly by a global frequency control signal 316, each oscillator 410 is instead controlled by a compensated frequency control signal 442-1, 442-2, . . . , 442-N. To generate the compensated frequency control signals 442-1, 442-2, . . . , 442-N, the offset calibration signals 328-1, 328-2, . . . , 328-N are combined with frequency control signal 316 via adders 440-1, 440-2, 440-N. As described above, the offset calibration signal 328 for a given oscillator represents specific frequency characteristics of the individual oscillator and can be adjusted individually for each oscillator. Thus, for any given frequency control signal 316, each oscillator 410-1, 410-2, . . . , 410-N will be individually controlled based on the frequency control signal 316 and its specific offset calibration signal 328-1, 328-2, . . . , 328-N such that each oscillator will oscillate according to approximately the same frequency despite varying frequency characteristics between the oscillators. In alternative embodiments, adders 440 may instead be included in calibration module 330 instead of in multi-phase oscillator 306. Furthermore, offset calibration signals 328 may be combined with global frequency control signal 316 according to a different function (e.g., not necessarily a straight addition function) to achieve the desired frequency compensation.

Figure 5:
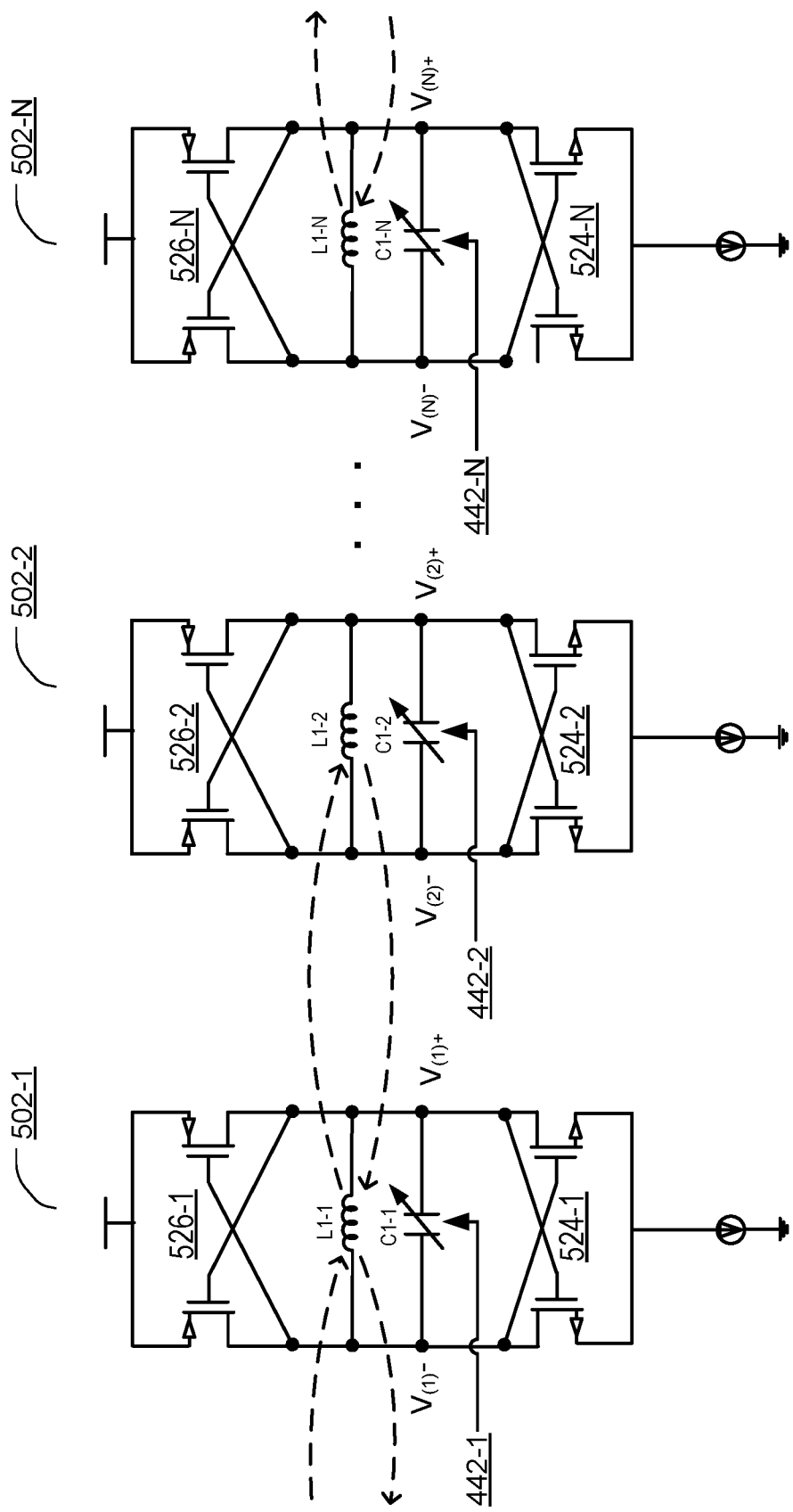
FIG. 5 illustrates a plurality of coupled LC-based oscillators collectively forming a multi-phase oscillator according to one embodiment.

FIG. 5 illustrates an example circuit diagram of oscillators 502-1, 502-2, . . . , 502-N that could be used to implement oscillators 410-1, 410-2, . . . , 410-N of a multi-phase oscillator 306 according to one embodiment. In each oscillator 502, inductor L1 and variable capacitor C1 form an LC tank for storing energy and generating one or more output signals V+, V− that oscillate at a particular frequency and at a particular phase relative to the phase of other oscillators in the loop. The frequency of the output oscillation signals V+, V− of each oscillator 502 depends on the inductance L1 and capacitance C1 values. In one embodiment, the oscillators 502 have a fixed inductor L1 and a variable capacitor C1 that can be varied to control oscillation frequency (e.g., via control signal 442). For example, in one embodiment, variable capacitor C1 can be implemented as a bank of parallel capacitors. In this embodiment, control signal 442 controls switches that couple or decouple different combinations of capacitors with the oscillator 502 to achieve the desired capacitance. Alternatively, an oscillator 502 could be implemented with a variable inductor L1 or with both a variable capacitor C1 and variable inductor L1.

The phase of the output oscillation signal V+, V− depends on the loop configuration. Two cross coupled transistor pairs 524 and 526 form an energy injection component to inject a negative resistance signal into the LC tank. Complementary versions of the output signals 318 may be taken at points V− or V+.

Inductor L1 of each oscillator 502 is magnetically coupled to inductors of at least two other oscillators as illustrated by the dashed lines. For example, inductor L1-1 of oscillator 502-1 is magnetically coupled to both the inductor L1-2 of oscillator 502-2 and inductor L1-N of oscillator 502-N. Inductor L1 of each oscillator 502 generates a magnetic flux in the inductors of adjacent oscillators. The magnetic flux generated in inductors L1 by the magnetic coupling injects energy into the LC tanks of adjacent oscillators. Oscillators 502-2 and 502-N may be further magnetically coupled to other oscillators (not shown) in this manner for any number N of oscillators.

In other embodiments, other configurations of the LC tank and energy injecting component are possible. For example, inductor L1 may be a center-tapped inductor that is connected to a supply voltage, and the energy injecting component may only include a single pair 524 of cross coupled transistors without the second pair 526 of cross coupled transistors.

Any number of oscillators 502 may be magnetically coupled to each other in a loop in this manner. By coupling multiple oscillators in this way, multiphase output oscillation signals may be produced such that each oscillator 502 generates an output oscillation with a constant phase difference from adjacent oscillators in the loop. This phase difference is a function of the number of oscillators N coupled together in the loop.

In alternative embodiments, oscillators 502 may instead be actively coupled via electrical connections between the oscillators. For example, in one embodiment, the coupling can be established through active devices such as transistors. In one such embodiment, a pair of transistors driven by one oscillator can inject a signal to another oscillator.

In other alternative embodiments, different types of oscillators may be used as oscillators 410 in FIG. 4 that are not necessarily LC-based oscillators. For example, in one embodiment, each oscillator 410 of FIG. 4 is implemented as a ring oscillator.

Calibration Process

Figure 6:
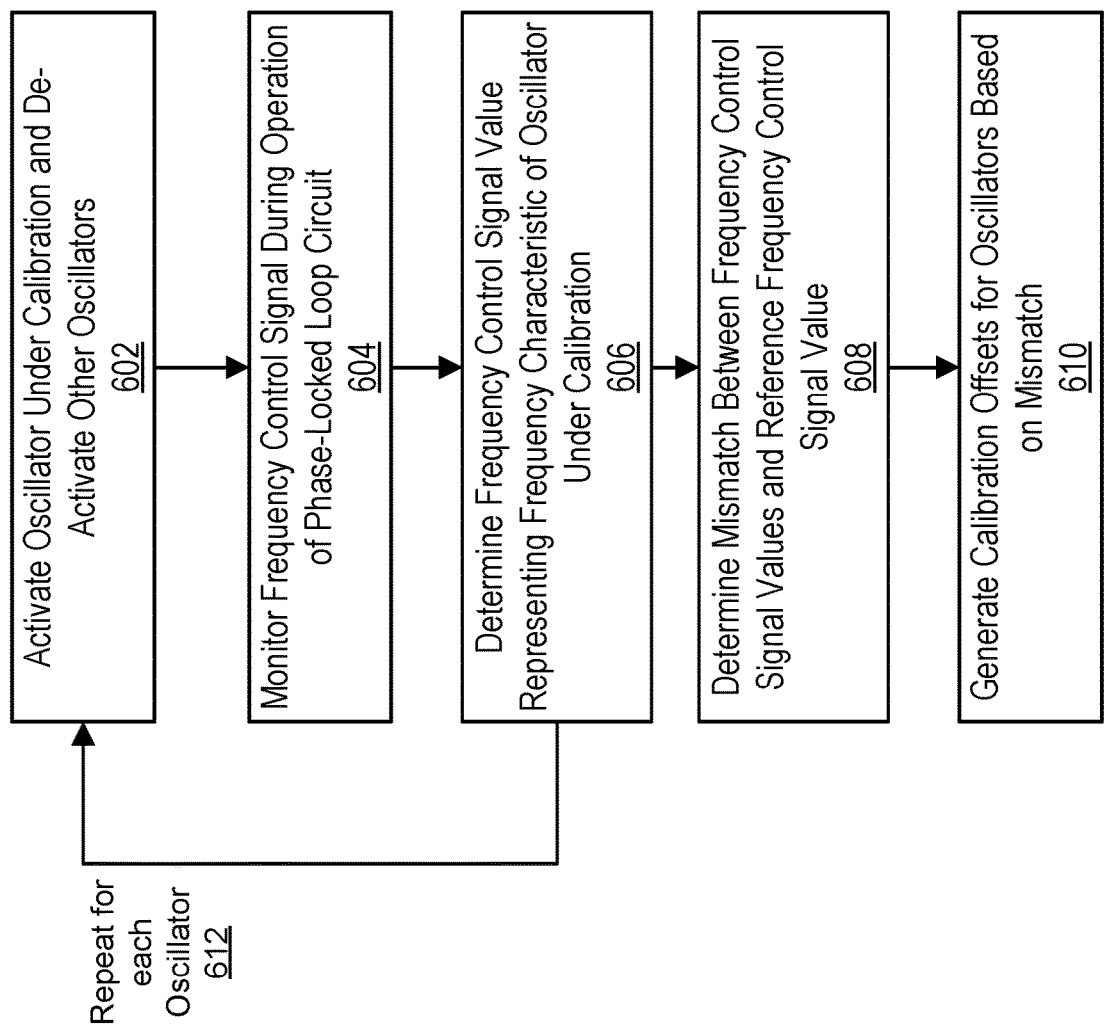
FIG. 6 is a flowchart illustrating a process for calibrating a multi-phase oscillator in a phase-locked loop circuit according to one embodiment.

FIG. 6 illustrates an embodiment of a process for calibrating multi-phase oscillator 306. This process may be performed, for example, as a one-time process when the PLL chip is manufactured, upon startup of the PLL circuit 300, and/or based on a calibration input control.

Referring to FIGS. 3 and 4 together with FIG. 6, during the calibration phase, calibration module 330 sequentially isolates different oscillators (e.g., oscillators 410-1, 410-2, . . . 410-N) of the multi-phase oscillator 306 via enable/disable signal 326 so that each oscillator can be independently calibrated. For example, calibration module 330 may first configure the multi-phase oscillator 306 in a first configuration in which a first oscillator 410-1 to be calibrated is active 602 (e.g., turned on) and the remaining oscillators 410-2 . . . 410-N are de-activated (e.g., turned off). For example, in one embodiment, enable/disable signal 326 controls switches that decouple inactive oscillators from their power supplies. Thus, for example, when oscillator 410-1 is under calibration, oscillator 410-1 is coupled to its power supply while oscillators 410-2 . . . 410-N are decoupled. In another embodiment, enable/disable signal 326 controls current through the oscillators 410 to reduce current to inactive oscillators such that the inactive oscillators will not oscillate, while causing sufficient current to flow to the oscillator under calibration to achieve the desired oscillation. Alternatively, enable/disable signal 326 may control switches that remove the coupling between the oscillator under calibration and the other oscillators, without necessarily turning off the other oscillators. Thus, for example, when oscillator 410-1 is under calibration, the coupling between oscillator 410-1 and oscillators 410-2, 410-N can be removed in order to isolate oscillator 4101. In any of the above cases, the enable/disable signal 326 controls the multi-phase oscillator 306 so that its outputs 318 substantially reflect frequency characteristics of only the individual oscillator under calibration independently of the characteristics of the other oscillators. Furthermore, select signal 324 controls multiplexer 322 to select the appropriate output signal 318 from the oscillator under calibration so that the oscillator under calibration will control the phase-locked loop circuit 300. Thus, for example, when oscillator 410-1 is under calibration, multiplexer 322 will select output signal 318-1.

The calibration module 330 monitors 604 frequency control signal 316 during operation of the phase-locked loop circuit 330 while the oscillator under calibration is enabled and the remaining oscillators are disabled. Based on the feedback control nature of PLL circuit 300, frequency control signal 316 will represent a frequency characteristic of the individual oscillator under calibration. Once the phase-locked loop circuit 330 stabilizes, the calibration module 330 determines 606 a frequency control signal value representing a frequency characteristic of the oscillator under calibration. For example, in one embodiment, the calibration module 330 determines a center frequency for the oscillator under calibration. The center frequency represents the average of the maximum and minimum operating frequency of the oscillator across its full control range (i.e., the range where frequency control signal 316 stabilizes for various input frequencies). Thus, in one embodiment a range of reference frequencies $f_{ref}$ is applied during calibration of each oscillator in order to determine a center frequency. The calibration process described above in steps 602, 604, 606 is repeated 612 for each of the oscillators of the multi-phase oscillator 306 to determine a frequency control signal value (e.g., a center frequency) for each oscillator. These steps are performed using the same set of PLL parameters (e.g., reference frequency, divider ratio, etc.) in order to determine the relative responses of the oscillators to the same set of parameter.

Based on the determined frequency control signal values, the calibration module 330 determines 608 a mismatch between each of the determined frequency control signal values and a reference frequency control signal value. In one embodiment, the reference frequency control signal value is selected from among the determined frequency control signal values for the various oscillators. For example, the reference frequency control signal value may correspond to a predetermined reference oscillator. Alternatively, the reference frequency control signal may represent the median frequency control signal value. In other embodiments, the reference frequency control signal value may be a different frequency control signal value that is not necessarily one of the determined frequency control signal values. For example, the reference frequency control signal may be a predetermined reference frequency control signal value, an average frequency control signal value of the determined frequency control signal values, etc.

The calibration module 330 then generates 610 calibration offsets for each oscillator based on the determined mismatch. Thus, for example, if oscillator 410-1 is under calibration, the calibration module 330 generates offset calibration signal 328-1. The offset for a particular oscillator is used by that oscillator to compensate for its mismatch from the reference frequency control signal value, thereby reducing or eliminating problems associated with frequency mismatch. For example, in oscillator 410-1, offset calibration signal 328-1 is summed with frequency control signal 316 via adder 440-1 to provide a compensated frequency control signal 442-1 for controlling oscillator 410-1 during regular operation. Note that prior to the calibration sequence described above, offset calibration values 328 may initially be set to zero or some other initial value.

An example calibration is now described for a multi-phase oscillator 306 having four oscillators A-D controlled via a digital 4-bit frequency control signal 316. During steps 602-606 of the calibration process, the following frequency control codes (e.g., representing a center frequency) $C_{Fk}$ are determined for the various oscillators:

| Oscillator | Frequency Control Codes ($C_{Fk}$) |
| --- | --- |
| A | 0011 |
| B | 0010 |
| C | 0011 |
| D | 0110 |

Thus, for the same PLL parameters (e.g., reference frequency, divider ratio, etc.) in this example, oscillators A and C tend to oscillate with the same frequency (thus corresponding to the the same frequency control code). Oscillators B and D tend to oscillate at frequencies corresponding to control codes different from those of oscillators A and C and different from each other due to varying physical characteristics of the oscillators. In this example, the calibration module 330 uses frequency control code 0011 as a reference center frequency $C_{Fr}$ because it corresponds to a median frequency of the oscillators. In step 608-610, calibration module determines the mismatch from the reference frequency and generates offset calibration codes as $C_{Fk}-C_{Fr}$:

| Oscillator | Offset Calibration Codes ($C_{Fo}$) |
| --- | --- |
| A | 0000 |
| B | −0001 |
| C | 0000 |
| D | +0011 |

These offset calibration codes ($C_{Fo}$s) are stored in registers associated with each of the oscillators A-D. During operation of the PLL, the offset calibration code for each oscillator is added to the global frequency control code (e.g., represented by signal 316). Thus, for example, if a global frequency control code $C_{Fg}$ of 0011 is applied to the multi-phase oscillator 306 based on operation of the PLL circuit 300, the inputs 442 applied to each individual oscillator will be determined as $C_{Fg}+C_{Fo}$:

| Oscillator | Compensated Frequency Control Codes |
| --- | --- |
| A | 0011 |
| B | 0010 |
| C | 0011 |
| D | 0110 |

Thus, based on the compensated frequency control codes, oscillator B has a slightly lower code applied to it than oscillators A and C. Similarly, oscillator D has a higher code applied to it than oscillators A and C. As a result of using the calibrated values, the oscillators will oscillate with approximately the same frequency for any given PLL parameters, thereby reducing or eliminating problems associated with mismatch.

Upon reading this disclosure, those of ordinary skill in the art will appreciate still alternative structural and functional designs for a frequency synthesizer and calibration process, through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the scope of the disclosure as defined in the appended claims.

What is claimed is:

1. A multi-phase oscillator circuit comprising:
a first oscillator to receive a first compensated frequency control signal and to generate a first output signal having a frequency corresponding to a global frequency control signal and a first phase;
a second oscillator to receive a second compensated frequency control signal and to generate a second output signal having the frequency corresponding to the global frequency control signal and a second phase different than the first phase; and
a frequency compensation circuit to receive the global frequency control signal and to generate the first compensated frequency control signal for controlling the first oscillator and the second compensated frequency control signal for controlling the second oscillator based on detected variations in frequency characteristics between the first oscillator and the second oscillator.

2. The multi-phase oscillator circuit of claim 1, wherein the frequency compensation circuit comprises:
a first adder to receive a first frequency compensation value and to combine the global frequency control signal and the first frequency compensation value to generate the first compensated frequency control signal;
a second adder to receive a second frequency compensation value and to combine the global frequency control signal and the second frequency compensation value to generate the second compensated frequency control signal.

3. The multi-phase oscillator circuit of claim 1,
wherein the first oscillator comprises a first inductor-capacitor tank to store energy for generating the first output signal, the first inductor-capacitor tank comprising a first inductor and a first capacitor;
wherein the second oscillator comprises a second inductor-capacitor tank to store energy for generating the second output signal, the second inductor-capacitor tank comprising a second inductor and a second capacitor;
wherein the first inductor is magnetically coupled to the second inductor to inject energy into the second inductor-capacitor tank.

4. The multi-phase oscillator circuit of claim 1, further comprising:
an oscillator isolation circuit switchable between a first configuration in which the first oscillator is active and the second oscillator is inactive and a second configuration in which the second oscillator is active and the first oscillator is inactive.

5. The multi-phase oscillator circuit of claim 4, wherein the oscillator isolation circuit comprises:
one or more switches to couple the first oscillator to a power supply and to decouple the second oscillator from the power supply in the first configuration, and to couple the second oscillator to the power supply and to decouple the first oscillator from the power supply in the second configuration.

6. The multiphase oscillator circuit of claim 5, further comprising:
a multiplexer to receive the first output signal and the second output signal and to output the first output signal when in the first configuration and to output the second output signal when in the second configuration.

7. The multi-phase oscillator circuit of claim 1, further comprising:
a frequency calibration circuit to detect the variations in the frequency characteristics between the first oscillator and the second oscillator during a calibration stage and to generate the first frequency compensation value and the second frequency compensation value based on the detected variations.

8. The multi-phase oscillator circuit of claim 1, further comprising:
a multiplexer to receive the first and second output signal, to select a selected signal of the first and second output signals based on a multiplexer select signal, and to output the selected signal.

9. A method for operating a multi-phase oscillator circuit comprising:
receiving, by a frequency compensation circuit, a global frequency control signal;

generating, by a frequency compensation circuit, a first compensated frequency control signal for controlling a first oscillator and a second compensated frequency control signal for controlling a second oscillator based on detected variations in frequency characteristics between the first and second oscillators;
generating, by the first oscillator, a first output signal having a frequency corresponding to the global frequency control signal and a first phase; and
generating, by the second oscillator, a second output signal having the frequency corresponding to the global frequency control signal and a second phase different than the first phase.

10. The method of claim 9, wherein generating the first compensated frequency control signal and the second compensated frequency control signal comprises:
combining, by a first adder, the global frequency control signal and a first frequency compensation value to generate the first compensated frequency control signal;
combining, by a second adder, the global frequency control signal and a second frequency compensation value to generate the second compensated frequency control signal.

11. The method of claim 9, further comprising:
storing, by a first inductor-capacitor tank of the first oscillator, energy for generating the first output signal;
storing, by a second inductor-capacitor tank of the second oscillator, energy for generating the second output signal; and
injecting, by a first inductor of the first inductor-capacitor tank, energy into the second inductor-capacitor tank via a magnetic coupling of the first oscillator with the second oscillator.

12. The method of claim 9, further comprising:
switching an oscillator isolation circuit between a first configuration in which the first oscillator is active and the second oscillator is inactive and a second configuration in which the second oscillator is active and the first oscillator is inactive.

13. The method of claim 12, wherein switching the oscillator isolation circuit comprises:
controlling one or more switches to couple the first oscillator to a power supply and to decouple the second oscillator from the power supply in the first configuration; and
controlling the one or more switches to couple the second oscillator to the power supply and to decouple the first oscillator from the power supply in the second configuration.

14. The method of claim 12, further comprising:
receiving, by a multiplexer, the first and second output signal; and
outputting, by the multiplexer, the first output signal when in the first configuration and the second output signal when in the second configuration.

15. The method of claim 9, further comprising:
detecting, by a frequency calibration circuit, variations in frequency characteristics between the first oscillator and the second oscillator during a calibration stage; and
generating, by the frequency calibration circuit, the first frequency compensation value and the second frequency compensation value based on the detected variations.

16. The method of claim 9, further comprising:
receiving, by a multiplexer, the first and second output signal;

receiving, by the multiplexer, a multiplexer select signal;
selecting, by the multiplexer, a selected signal of the first and second output signals based on a multiplexer select signal; and
outputting, by the multiplexer, the selected signal.

17. A method for calibrating a multi-phase oscillator circuit, the multi-phase oscillator circuit having a set of oscillators that when activated generate a plurality of output signals having a common frequency and different phases, the method comprising:

monitoring operation of the multi-phase oscillator circuit in a first configuration in which a first oscillator in the set of oscillators is active and at least a second oscillator in the set of oscillators is inactive;

monitoring operation of the multi-phase oscillator circuit in a second configuration in which the second oscillator is active and at least the first oscillator is inactive;

detecting a mismatch between operation of the oscillators in the first configuration and the second configuration; and configuring an offset calibration component of at least one of the first oscillator and the second oscillator based on the mismatch.

18. The method of claim 17, wherein detecting the mismatch includes detecting a difference between a center frequency of the first oscillator and a center frequency of the second oscillator.

19. The method of claim 17, wherein monitoring operation of the multi-phase oscillator circuit in the first configuration comprises:

configuring a multiplexer to select an output of the first oscillator as a feedback control signal.

20. The method of claim 17, wherein the different phases of the plurality of output signals are separated by 180/N degrees where N represents a number of oscillators in the set oscillators.

* * * * *